United States Patent [19]
Goto et al.

[11] Patent Number: 5,843,277
[45] Date of Patent: Dec. 1, 1998

[54] DRY-ETCH OF INDIUM AND TIN OXIDES WITH C2H5I GAS

[75] Inventors: Haruhiro Harry Goto, Saratoga; Yuh-Jia Su, Cupertino; Yuen-Kui Wong, Fremont; Kam S. Law, Union City, all of Calif.

[73] Assignee: Applied Komatsu Technology, Inc., Tokyo, Japan

[21] Appl. No.: 577,645

[22] Filed: Dec. 22, 1995

[51] Int. Cl.$^6$ .................................................. H01L 21/306
[52] U.S. Cl. ...................... 156/643.1; 216/23; 216/24; 216/60; 216/67; 216/72; 216/76
[58] Field of Search ............................ 156/643.1, 656.1; 216/23, 58, 60, 67, 72, 76, 24

[56] References Cited

U.S. PATENT DOCUMENTS

| | | | |
|---|---|---|---|
| 4,878,993 | 11/1989 | Rossi et al. | 216/67 |
| 5,032,221 | 7/1991 | Roselle et al. | 156/643.1 |
| 5,094,978 | 3/1992 | Miyagaki et al. | 437/181 |
| 5,171,401 | 12/1992 | Roselle | 156/643.1 |
| 5,230,771 | 7/1993 | Roselle | 216/67 |
| 5,286,337 | 2/1994 | Tsou | 216/67 |
| 5,318,664 | 6/1994 | Saia et al. | 156/643.1 |
| 5,340,438 | 8/1994 | Roselle et al. | 216/67 |

FOREIGN PATENT DOCUMENTS

| | | |
|---|---|---|
| 374036 | 6/1990 | European Pat. Off. |
| 374036A2 | 6/1990 | European Pat. Off. |
| 5-251400 | 9/1993 | Japan |
| 6-151380 | 3/1994 | Japan |
| 91/19325 | 12/1991 | WIPO |

OTHER PUBLICATIONS

Ulvac Technical Journal, No. 42, pp. 31–36, 1995.

Calahorra et al. "Reactive Ion Etching of Indium–Tin–Oxide Films" J. Electrochem. Soc. vol. 136 (6), pp. 1839–1840, Jun. 1989.

Chakrabarti et al "Dry etching of III–V semiconductors in CH3I, C2H5I and C3H7I discharges" J. Vac. Sci. Technol. B 10 (6) pp. 2378–2386, Nov. 1992.

Z. Calahara et al, Reactive Ion Etching Of Indium–Tin–Oxide Films, J. Electrochem. Soc., vol. 136, Jun. 1989 pp. 1839–1840.

M. Mohri et al., Plasma Etching of ITO Thin Films Using a $CH_4/H_2$ Gas Mixture, Japanese Journal of Applied Physics, vol. 29, No. 10, Oct., 1990, pp. L 1932–L 1935.

Ulvac Technical Journal, No. 42, 1995, p. 31–36.

*Primary Examiner*—Nam Nguyen
*Assistant Examiner*—Anita Alanko
*Attorney, Agent, or Firm*—Fish & Richardson P.C.

[57] ABSTRACT

An RIE method and apparatus for etching through the material layer of a transparent-electrode (ITO) in a single continuous step at a rate better than 100 Å/min and with a selectivity better than 20 to 1 is disclosed. Chamber pressure is maintained at least as low as 60 mTorr. A reactive gas that includes ethyl iodide $C_2H_5I$ is used alone or in combination with another gas such as $O_2$. Plasma-induced light emissions of reaction products and/or the reactants are monitored to determine the time point of effective etch-through.

24 Claims, 5 Drawing Sheets

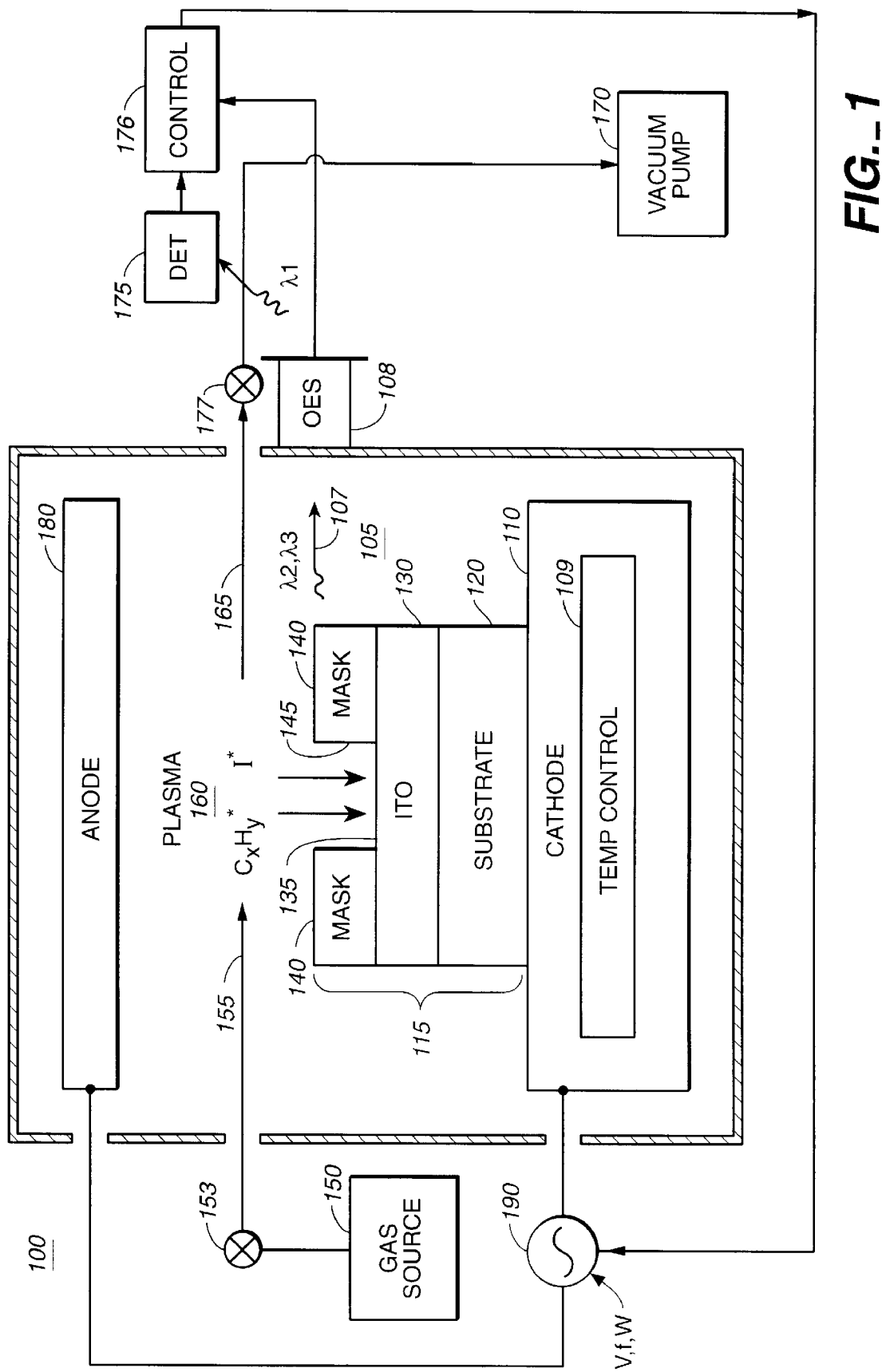
FIG._1

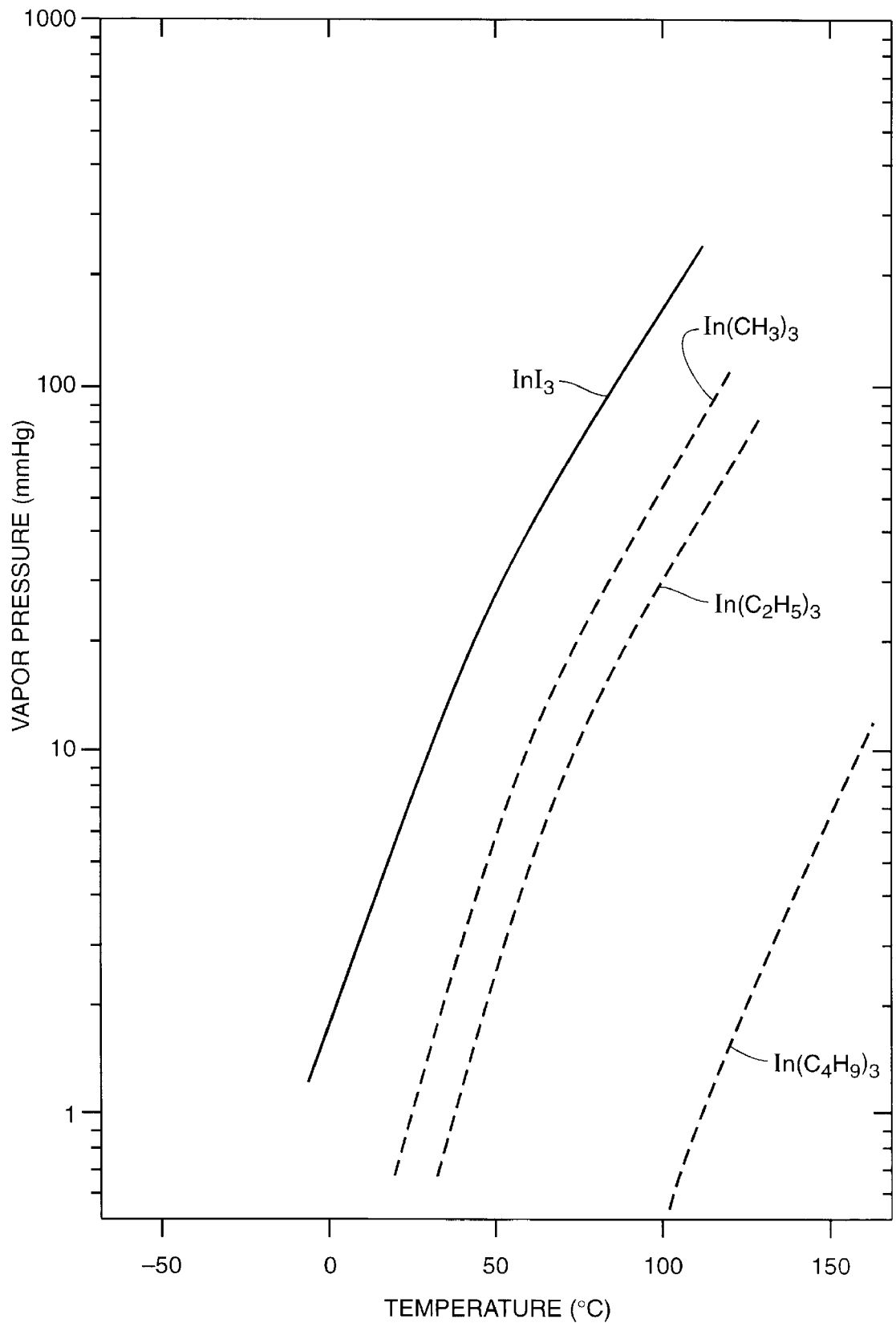
FIG._2

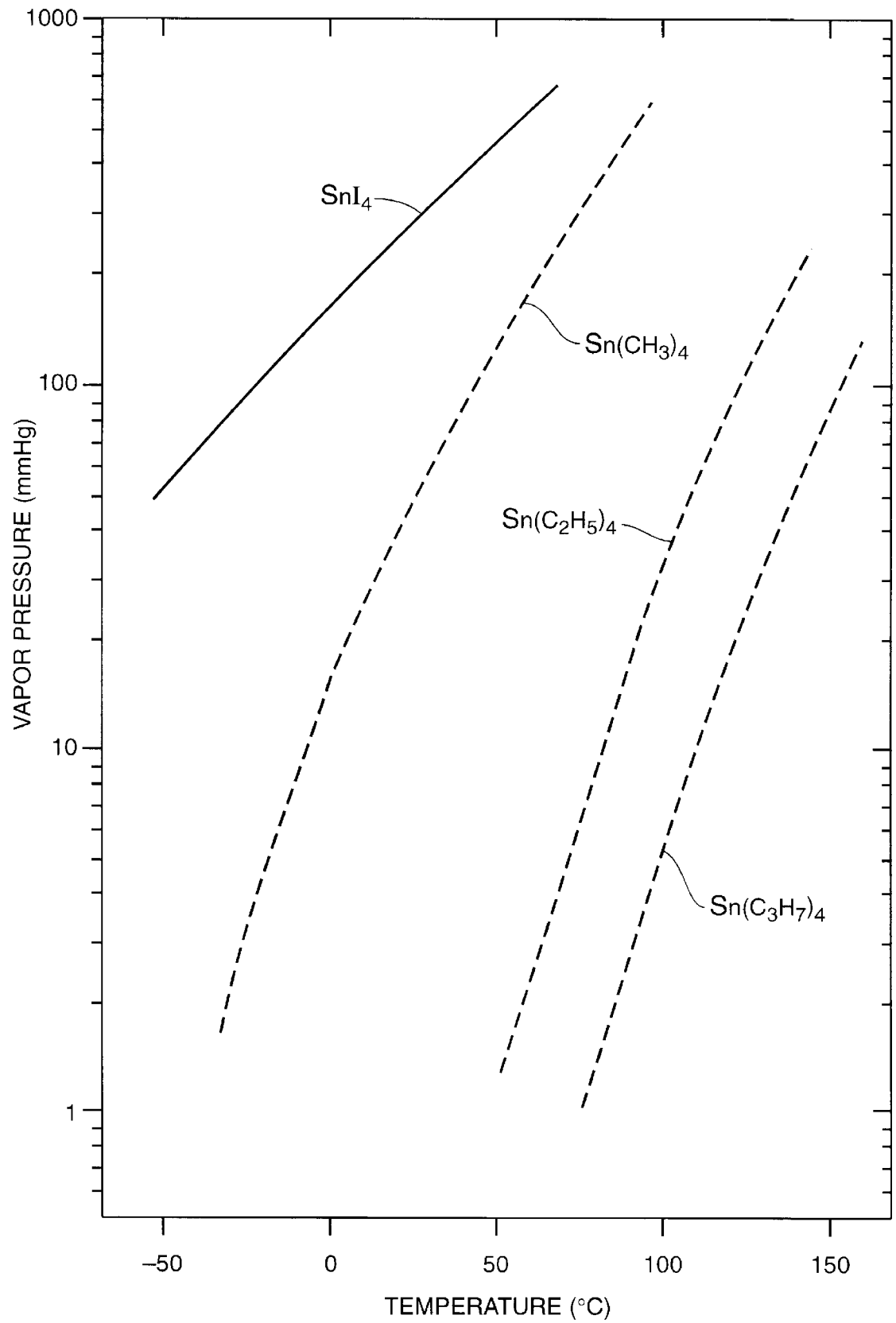
FIG._3

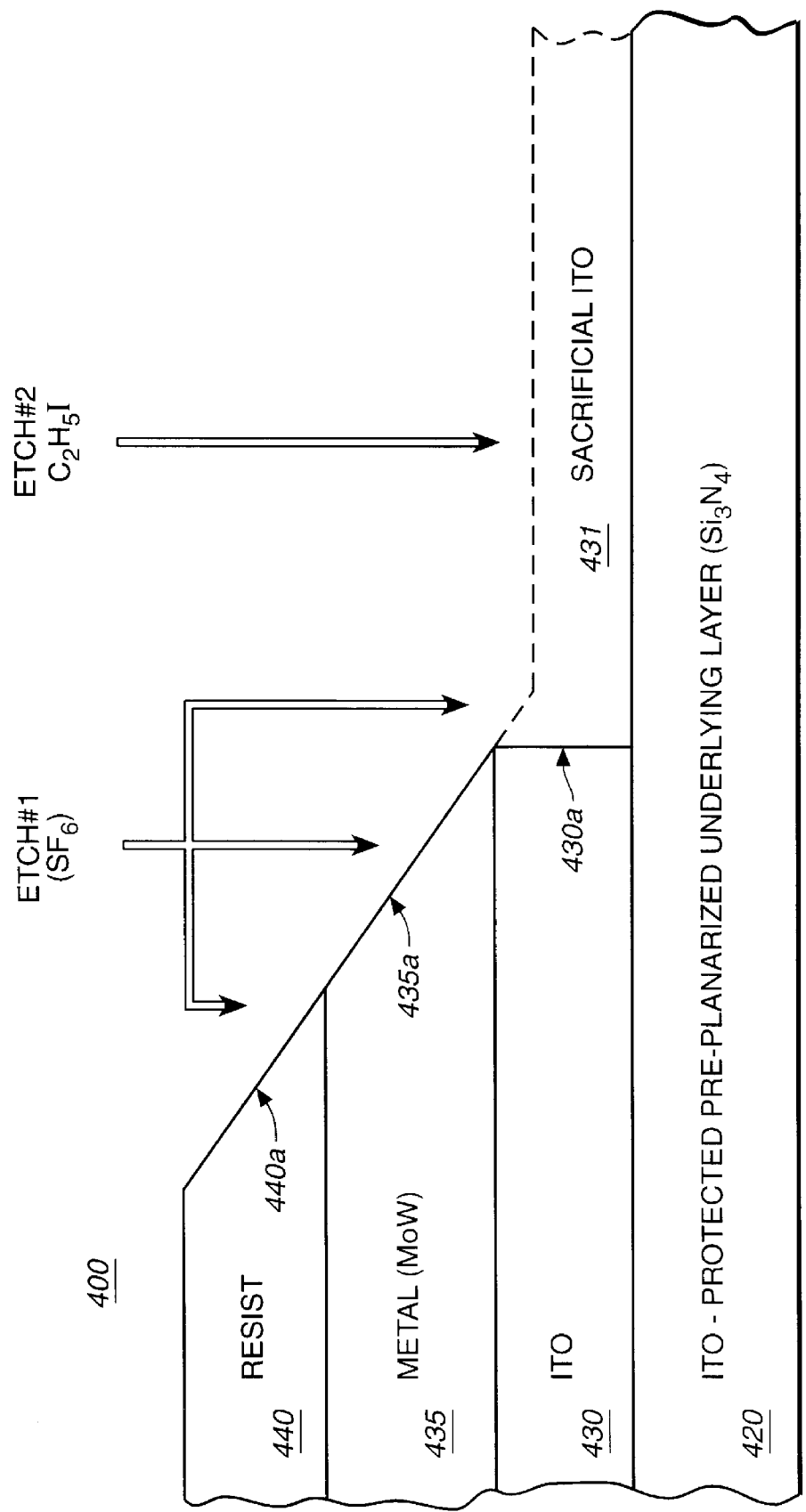
FIG._4

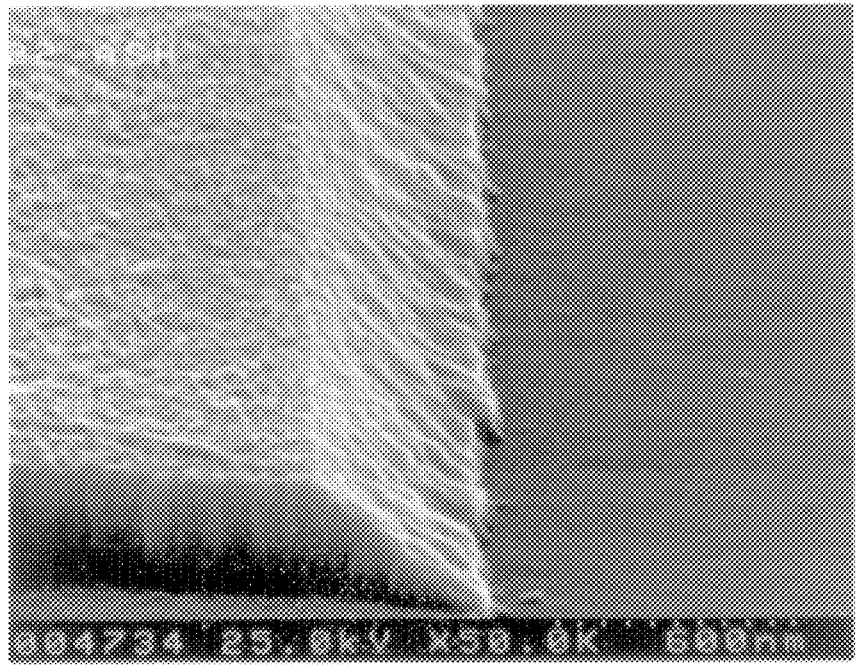
FIG._5A
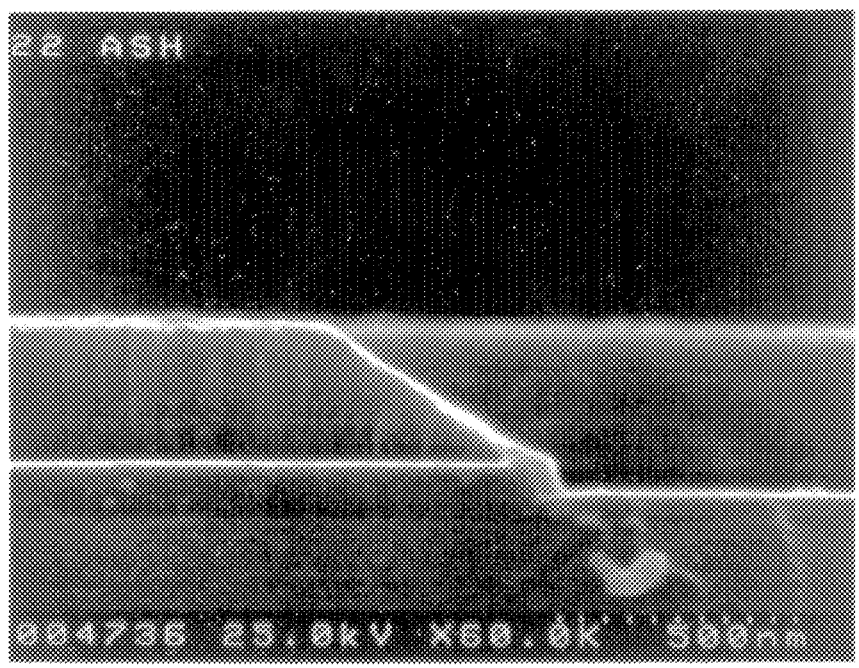
FIG._5B

DRY-ETCH OF INDIUM AND TIN OXIDES WITH C2H5I GAS

BACKGROUND

1. Field of the Invention

The invention is generally directed to plasma etching of indium and tin oxides. The invention is more specifically directed to reactive ion etch (RIE) of indium tin oxide (ITO) by reactive gases that include carbon, hydrogen and a halogen.

2. Cross Reference to Related Applications

The following copending U.S. patent application(s) is/are assigned to the assignee of the present application, is/are related to the present application and its/their disclosures is/are incorporated herein by reference:

(A) Ser. No. 08/273,382 filed Jul. 11, 1994 by Jerry Wong et al. and entitled, METHOD AND APPARATUS FOR ETCHING FILM LAYERS ON LARGE SUBSTRATE; and (B) Ser. No. 08/475,709 filed Jun. 7, 1995 by Yuh-Jia (Jim) Su et al. and entitled, HIGH-RATE DRY-ETCH OF INDIUM AND TIN OXIDES BY HYDROGEN AND HALOGEN RADICALS SUCH AS DERIVED FROM HCl GAS now U.S. Pat. No. 5,607,602.

DESCRIPTION OF THE RELATED ART

Opto-electronic devices such as liquid crystal displays (LCD's), charge coupled sensor devices (CCD's) and the like often include thin-film transparent electrodes disposed over, or under, or around optically functioning elements such as light-transmitting, or a light-receiving, or a light-reflecting elements.

The thin-film transparent electrodes may also extend adjacent to elements that do not provide an optical function.

The transparent electrodes are typically composed of an oxide of indium (InO) or an oxide of tin (SnO) or a mixture of these oxides or a compound having the general formulation: $In_xSn_yO_z$, where the z factor is greater than zero but less than 100%. The formulation, $In_xSn_yO_z$ is commonly known in the art as ITO. The specific formulation can vary depending on the method used for forming the ITO. In a more common form, the tin (Sn) component serves as a minor dopant that is added to a composition consisting mostly of indium oxide (InO).

During manufacture, a thin-film of the material making up the transparent electrodes is formed on a supporting substrate. The supporting substrate may have a homogeneous or heterogeneous surface composed of either or both optically-functioning materials and other materials. The supporting substrate may be composed of one or a plurality of materials selected from the group that includes but is not limited to: silicon dioxide (such as glass or quartz), or other silicon oxides, or silicon nitrides (such as $Si_3N_4$), or silicon oxi-nitrides of the general form $Si_xO_yN_z$ (where each of x, y, z is >0 and x+y+z=100%) or amorphous silicon, or other forms of silicon (such as monocrystalline and polycrystalline Si).

After formation on the supporting substrate, the transparent-electrode thin-film is selectively etched so as to remove pre-specified portions and thereby define a desired wiring pattern or an otherwise-functioning pattern on the supporting substrate.

Either after or before the step of selectively etching the transparent-electrode layer, other materials may be conformably deposited on the patterned transparent-electrode thin-film and also selectively etched as desired.

The patterned transparent-electrode thin-film may function alone or in cooperation with neighboring elements in a variety of ways, including but not limited to: transmitting optical signals, transmitting electrical signals, serving as part of an electrical capacitor, and serving as an etch stop or sacrificial etch barrier during the patterning of an adjacent material layer.

It is generally desirable in mass-production situations to etch the transparent-electrode thin-film in such a way that its etching does not significantly damage any neighboring structures.

It is additionally desirable to have high selectivity for the ITO layer as opposed the supporting substrate layer or any already-overlying materials. Selectivity is defined herein as the ratio of the removal rate of ITO to the removal rate of the other, neighboring material. Expressed mathematically, $$\text{Selectivity} = \frac{\text{Etch rate of } ITO \text{ (in Å/minute)}}{\text{Etch rate of Other (in Å/minute)}}$$

It is also generally desirable to perform the etch as quickly as possible and with as few steps as necessary in order to reduce mass-production complexity and costs.

It is further desirable to have an etch process that is fairly insensitive to the specific formulation ($In_xSn_yO_z$ where x, y, and z are variable and x+y+z=100%) of the material making up the transparent-electrodes.

It is additionally desirable to have an etch process that does not leave an optically interfering residue either on the transparent-electrodes or on the substrate that supports such electrodes.

Until fairly recently, the most common method for selective etch of ITO was to wet etch through a photo-lithographically lithographically patterned mask using chemically-reactive aqueous agents such as ferric chloride ($FeCl_3$).

Wet etching has drawbacks though. It tends to leave a liquid residue, which residue often needs to be removed prior to further processing. The residue removal step complicates the overall process and disadvantageously increases costs.

Another drawback of wet etching is that its material removal rate tends to be highly sensitive to temperature variations. Tight temperature control is needed to compensate and prevent over or under etching. This also complicates the overall process and increases costs. ('Under etching' refers here to the condition where the transparent-electrode thin-film is not etched through thoroughly and undesired shorts appear in the resultant conductor pattern. 'Over etching' refers here to the condition where the transparent-electrode thin-film is etched through thoroughly and undesired etching of the underlying substrate begins and/or time and resources are wasted in trying to etch to a depth beyond that needed.)

Yet a further drawback of wet etching is that it is isotropic. Over etching may lead to undesired undercutting beneath the etch mask. The undercutting may be so extensive that it leads to unintended open circuits in the conductor pattern.

More recently, attempts have been made to overcome the problems of wet etching by instead dry etching the material layer of the thin-film transparent electrodes with anisotropic reactive plasma.

U.S. Pat. No. 5,094,978, issued Mar. 10, 1992 to Miyagaki et al., METHOD OF PATTERNING A TRANSPAR- ENT CONDUCTOR, reports successful dry etching of ITO with nitrogen trifluoride ($NF_3$). Miyagaki indicates that it is not possible to dry etch materials such as ITO, $In_2O_3$ and $SnO_2$ with a reactive halogen gas (col. 3, lines 22–27).

A more recent U.S. Pat. No. 5,318,664, issued Jun. 7, 1994 to Saia et al., PATTERNING OF INDIUM-TIN OXIDE VIA SELECTIVE REACTIVE ION ETCHING, indicates limited success with plasma etching of ITO using HCl. Saia reports an etch rate of as much as 60 Angstroms per minute (60 Å/min) for plasma etching of ITO with HCl. Saia cautions, however, that HCl should not be used for concluding the etch-through of ITO because HCl is not selective with respect to any underlying silicon. Saia teaches to instead use a non-halogenated gas such as an acetone/oxygen plasma for completion of the etching through of the ITO layer.

Multi-step plasma etch processes such as that taught by Saia U.S. Pat. No. (5,318,664) are disadvantageous in that the switching over from one etch process (e.g., HCl plasma) to another (e.g., acetone/oxygen plasma) complicates the overall manufacturing process, increases costs and tends to reduce yields. The 60 Å/min etch rate reported by Saia for etching ITO with an HCl plasma is relatively slow for mass production needs.

Z. Calahara et al claim in a paper entitled REACTIVE ION ETCHING OF INDIUM-TIN-OXIDE FILMS, J. Electrochem Soc., Vol. 136, Jun. 1989, pp 1839–1840 to have achieved rates as high as 800–900Å/min using HI as the dry-etch gas at a pressure of 60 mTorr. HI suffers from the problem that it is a highly corrosive material that is difficult to obtain in a highly purified form commercially.

SUMMARY OF THE INVENTION

It is an object of the invention to provide single-step etch-through of a thin-film that consists essentially of indium or tin oxides or ITO.

It is a further object of the invention to provide relatively high etch rates of better than 100 Å/min in a reactive ion etch process where ITO is selectively removed.

It is yet a further object of the invention to provide relatively high selectivity of at least approximately 5.0 and more preferably, approximately 10.0 or approximately 20.0 or better with respect to etching ITO over etching a supporting substrate composed of silicon oxides and/or silicon nitrides and/or amorphous silicon.

In accordance with the invention, the gaseous compound, ethyl iodide ($C_2H_5I$) is used as a primary input gas for reactive ion etching of a transparent-electrode material layer consisting essentially of oxides of indium (InO) and/or of oxides of tin (SnO) and/or of ITO ($In_xSn_yO_z$).

The ethyl iodide ($C_2H_5I$) may be input in gas form into the reactive ion etch chamber either by itself or mixed in with one or more other reactive gases such as oxygen ($O_2$), and/or with essentially non-reactive gases such as argon (Ar), nitrogen ($N_2$) and/or helium ($He_2$). Inclusion of oxygen is preferred for removing carbonaceous depositions from the electrode-supporting, optically-utilized substrate. Chamber pressure during etching is preferably in the range of approximately 40 milliTorr to 60 Torr (40 Torr $\geq P \leq$ 60 Torr).

In one embodiment, ethyl iodide ($C_2H_5I$) is vaporized at room temperature by inputting it into a low-pressure system ($\leq$60 Torr) at a rate of approximately $40N_2$ to $100N_2$ (where $N_2$ indicates here the mass flow control value for an equivalent amount of nitrogen gas in terms of sccm) in combination with an input flow of oxygen ($O_2$) at approximately 10 to 30 sccm.

In accordance with a second aspect of the invention, a single process step is used to etch completely through the material layer of the transparent electrode.

In accordance with a third aspect of the invention, the dry etch exhaust from the transparent electrode material layer is spectroscopically analyzed to determine when effective etch-through has been achieved. The etch process is halted at that point to prevent undesired etching into underlying material and/or to minimize consumption of power and materials.

Experiments by the present inventors show that maintaining chamber pressures in the range of 40 milliTorr to 60 Torr while maintaining $C_2H_5I$ flow rate in the range between approximately $40N_2$ and approximately $100N_2$ (where the sccm of $N_2$ is used as an MFC or 'mass flow control' value) creates selective etch conditions for ITO on a glass substrate having a selectivity factor at least as good as 5 to 1, and often times as high as 10 to 1 or better (depending on the specific formulation of the ITO). Moreover, the same etch conditions produce a selectivity factor as high as approximately 20 to 1 or better for ITO on a silicon nitride substrate or on an amorphous silicon substrate.

BRIEF DESCRIPTION OF THE DRAWINGS

The invention will be described with reference to the following drawing(s) in which:

FIG. 1 is a cross-sectional schematic of a reactive ion etch (RIE) system for carrying out a dry etch process in accordance with the invention;

FIG. 2 is a plot showing expected volatizable byproducts from the reaction of indium (In) with free radicals such as $CH_3$, $CH_2$, $C_2H_5$, and I which may be released in plasma from the input $C_2H_5I$ gas; and FIG. 3 is a plot showing expected volatizable byproducts from the reaction of tin (Sn) with free radicals such as $CH_3$, $CH_2$, $C_2H_5$, and I which may be released in plasma from the input $C_2H_5I$ gas.

FIG. 4 is a cross sectional view showing how ITO may function as an etch stop for patterning of an overlying MoW layer, this being followed by highly selective etching of the ITO relative to a sacrificially-protected underlying support layer.

FIG. 5 shows perspective and cross sectional view micrographs of an MoW on ITO on $Si_3N_4$ structure formed in accordance with the invention.

DETAILED DESCRIPTION

FIG. 1 schematically shows in cross-section a reactive ion etch system 100 in accordance with the invention. (A more detailed mechanical description of the basic etching apparatus may be found for example in the above-cited application Ser. No. 08/273,382.)

System 100 includes a substrate-supporting cathode 110 that is spaced-apart from an opposed anode 180 within a low-pressure chamber 105. Anode 180 may be a discrete element as shown or it may defined by one or more of the inner walls of the etch chamber 105 rather than being a separate element. In one embodiment, the chamber inner walls define the anode and the cathode is placed centrally within the chamber so that multiple faces of the cathode oppose corresponding inner walls of the chamber. The latter embodiment allows for simultaneous etch of two or more workpieces in one chamber.

A radio frequency (RF) generator 190 is coupled electrically to the cathode and anode for producing an RF field between the opposed faces of the cathode and anode. The RF field may be of a single frequency or multiple frequencies. (Typically a combination is used of approximately 13 MHz for plasma creation and approximately 400KHz for ion acceleration).

A gas supply means 150 is operatively coupled to the low-pressure chamber 105 for supplying a selected one gas or a selected combination of gases 155 into chamber 105. The selectable gases include $C_2H_5I$, oxygen ($O_2$), hydrogen chloride (HCl), chlorine ($Cl_2$), argon (Ar), nitrogen ($N_2$) and helium ($He_2$). Although not specifically shown, a heating element may be included in the gas supply means 150 for heating the $C_2H_5I$ above its boiling point of 72° C. so as to maintain the $C_2H_5I$ in gaseous form.

A flow-rate control means (e.g., a valve) 153 is provided for regulating the respective inflow rate of each of the selected gases 155 so as to maintain a desired level of inflow (e.g., 30 sccm of $O_2$ which is the flow of $O_2$ gas which fills up per minute a volume of 30 cc to a pressure of 1 atm at 0° C.).

Preferably there is no inert carrier gas such as argon, helium or nitrogen in the input gas stream 155 because more work is needed to exhaust this additional material for purposes of maintaining low pressure, however, one may use one or more such inert gases as a carrier for the reactive gases in inflow 155 if desired. As will be explained below, a small amount of $O_2$ is preferably mixed in with the $C_2H_5I$ gas for volatilizing and removing carbonaceous depositions that may be produced from the organic compound, $C_2H_5I$.

A vacuum means 170 is coupled to the low-pressure chamber 105 for evacuating exhaust gases 165 from the chamber 105 and for maintaining a desired low pressure within the chamber 105.

A spectroscopic analyzer means 175 is optionally provided along the exhaust path of vacuum means 170 for optically scanning the exhaust gases 165 using an appropriately selected one or more scanning wavelengths $\lambda 1$ and/or filters, analyzing the results, and thereby determining the chemical composition of the exhaust gases 165. The spectroscopic analyzer means 175 is preferably designed to distinguish between exhaust gases 165 that do or do not contain one or more compounds in the byproduct group consisting of: water vapor ($H_2O$), indium iodides ($In_xI_y$), tin iodides ($Sn_xI_y$), tin hydrides (SnH), indium carbohydrates ($In_xC_yH_z$) and tin carbohydrates ($Sn_xC_yH_z$), where x, y and z are variable combinations defining volatized species.

The spectroscopic analyzer means 175 is coupled to an etch-control means 176 that turns off the RF generator 190 and thereby halts the etch process when the analyzer means 175 indicates that effective etch-through has been achieved.

The term 'effective etch-through' is used here to mean the condition when etching has progressed sufficiently far into the transparent-electrode layer so that a useable wiring pattern is created in the transparent-electrode layer without leaving behind undesired shorts or low resistance paths between conductors of that layer that are to be electrically isolated from one another.

Provided in the same embodiment or separately in another embodiment, there is a second spectroscopic detector means referred to as an OES (Optical Emission Spectroscope) 108 installed approximately in line with the workpiece surface so as to detect plasma induced light emission $\lambda 2$ of In or Sn in the approximate plane 107 of surface portion 135. The OES 108 is coupled to the etch-control means 176 so as to turn off the RF generator 190 and thereby halt the etch process when effective etch-through is indicated to have been reached by an empirically-determined reduction in $\lambda 2$ emissions of In or Sn in the approximate plane 107.

In one embodiment, the OES 108 includes an optical detector that is tuned to distinctly detect one or more of the characteristic emission lines of In at $\lambda_2$ equal to approximately 451 nanometers and 410 nm. (The detection response of the optical detector is typically set to the slightly broader range of 451±1 nm and 410±1 nm.)

The OES 108 has a faster response time than the exhaust spectroscopic analyzer means 175 because the OES 108 does not wait for exhaust gases to reach it. When used in combination with the OES 108, the exhaust spectroscopic analyzer means 175 may be used to verify readings obtained from the OES 108 to assure that the OES 108 is operating correctly before plasma shut off occurs.

Another way that the time point of effective etch-through of material layer 130 can be determined is by looking for peaks in plasma induced light emission $\lambda 3$ of $CH_3$ and/or I in the approximate plane 107 of surface portion 135. While there is still In or Sn available for reaction with and consumption of free radicals such as $CH_3$ and/or $CH_2$ and/or $C_2H_5$ and/or I in the vicinity surface portion 135, the concentration of these free radicals ($CH_3$, $CH_2$, $C_2H_5$, I) remains diminished in this vicinity. However, once effective etch-through has been achieved, there is a substantial decrease in the In or Sn available for reaction with the corresponding free radicals ($CH_3$, $CH_2$, $C_2H_5$, I) and a concentration peak shows in the wavelengths of the corresponding free radicals ($CH_3$, $CH_2$, $C_2H_5$, I). The RF generator 190 can be turned off in response to detection of such a peak in the monitored wavelengths of the corresponding free radicals ($CH_3$, $CH_2$, $C_2H_5$, I) to thereby halt the etch process at the point of etch-through.

Alternatively, the combination of $CH_3$, $CH_2$, $C_2H_5$, I emission peaks and In and/or Sn emission minima may be used to determine the time point for turning of f RF generator 190.

In yet another variation, if the material of substrate is susceptible to etching by the free radicals ($CH_3$, $CH_2$, $C_2H_5$, and most particularly, I) released from the $C_2H_5I$, then OES 108 can be further used to detect plasma induced light emission by the released constituents of the substrate as etch-through is achieved and the detection of this event may also be used to determine the time point for turning off RF generator 190.

A pressure regulating means 177 is provided along the exhaust path of vacuum means 170 for maintaining a desired pressure level within chamber 105. The desired pressure level is preferably at least as low as approximately 60 Torr, more preferably at least as low as approximately 40 Torr.

A workpiece 115 having a to-be-etched transparent-electrode material layer 130 is mounted on cathode 110. The workpiece 115 typically includes a substrate 120 onto which the transparent-electrode material layer 130 has been deposited. The substrate 120 may be composed of one or more layers of materials such as glass ($SiO_2$) or silicon nitride ($Si_3N_4$) or amorphous silicon (a-Si) or poly or monocrystalline silicon (p-Si or Si) or other materials as may be suitable for a specific opto-electronic application.

The transparent-electrode material layer 130 may be a thin-film having a thickness of 1500 Å or less and consisting essentially of ITO or an indium oxide or a tin oxide or a mixture of these oxides.

A pre-patterned mask 140 that has been formed by photolithography or other suitable means is provided above the to-be-etched material layer 130. Mask 140 has an aperture 145 defined therethrough for exposing a surface portion 135 of the to-be-etched transparent-electrode material layer 130. Unexposed portions of material layer 130 are protected from etching by the material of the mask 140. Mask 140 may be composed of materials such as photoresist deposited to a thickness of 1.5 µm.

Chamber 105 is appropriately sealed to maintain pressures therein at least as low as 60 Torr, and more preferably at least as low as 40 Torr in the vicinity of workpiece 115. The vacuum means 170 is operated so as to exhaust gases from chamber 105 and to create a pressure within the chamber of approximately 60 Torr or less, and more preferably of approximately 40 Torr.

The RF generator 190 is activated by etch-control means 176 so as to provide an oscillating electric field between the cathode 110 and anode 180 for etching through the exposed portion of material layer 130 in a single step and stopping after effective etch-through has been achieved.

The frequency (f) of the generated RF field is preferably in the range of approximately 400 KHz to approximately 13.6 MHz. If desired, the generated RF field may have a combination of multiple frequencies such as both 13.6 MHz and 400 KHz and these combined multiple frequencies may be developed by separate oscillators. The lower frequency field is often developed so as to predominate in the vicinity of the substrate-supporting cathode 110 and is referred to as the pedestal RF. The higher frequency field is often developed so as to predominate in the vicinity of the plasma above the workpiece 115 and is referred to as the plasma RF.

The power density (W) of the applied RF field is preferably at least 1 watt per centimeter squared (1 $W/cm^2$) approximately as measured relative to the exposed surface area 135 of material layer 130 and more preferably, approximately 2 $W/cm^2$ or more.

The intensity (volts/cm) of the RF field is sufficiently large to disassociate the introduced $C_2H_5I$ gas 155 into atomic constituents (free radicals). In one embodiment, field intensity in the range of 300 to 800 volts/cm is created in the vicinity of the exposed surface portion 135 of material layer 130.

Gas source 150 supplies a steady stream of the reactive gas 155. A reactive gas consisting essentially of ethyl iodide ($C_2H_5I$) or of a mixture of $C_2H_5I$ and $O_2$ is preferred. Other ITO etchants such as $CH_3I$, HI, HCl or $Cl_2$ may be further included in the stream of a reactive gas 155 if desired.

The flow rate of the supplied $C_2H_5I$ gas is preferably in the range of approximately $40N_2$ to $100N_2$ in terms of mass flow control value (MFC). When the inflow rate of the supplied $C_2H_5I$ gas was raised significantly above this during tests, it was found that the vacuum means 170 could not pump the exhaust out fast enough, chamber pressure rose above the desired 40–100 mTorr range and the reaction shifted toward net deposition instead of net material removal.

A temperature control means 109 (e.g., a fluid-cooled heat exchange) is coupled to the cathode 110 for maintaining a cathode temperature in the range of approximately 0° C. to 100° C. The temperature of substrate 120 is preferably maintained at approximately 100° C. or less and more preferably at 60° C. or less to prevent damage to the films on the substrate 120. The temperature of the substrate 120 is determined by thermal transfer through the cathode 110 to temperature control means 109. The temperature in the plasma 160 that forms in the vicinity of surface portion 135 can be significantly higher and tends to be sporadic as the plasma fluctuates.

In general, the temperature of the workpiece 115 should be kept below approximately 130° C. to prevent reticulation damage to the photoresist layer 140. Some UV-treated formulations of photoresist can withstand up to approximately 150° C.

Although not shown, additional temperature control means are provided about the walls of the chamber 105 for controlling the temperatures of the inner surfaces of these chamber walls. The additional temperature control means (not shown) may be in the form of electric heaters and/or heat exchange water jackets buried in the chamber walls between their inner and outer surfaces. Temperature sensors are also generally included in the chamber wall temperature control means (not shown) for determining the current temperatures of the inner surfaces of the chamber walls and for generating feedback signals for use in PID (proportional integral differential) feedback control of wall temperatures. The chamber wall temperature control means (not shown) are preferably capable of maintaining inner surface, wall temperatures in the range of at least approximately 20° C. to 60° C. at a precision of ±1° C. or better. Wider temperature ranges are, of course also contemplated. Wall temperature control is desirable for limiting deposition of reaction byproducts on the inner surfaces of the chamber walls. In one embodiment, the target temperatures of both the cathode temperature control means 109 and the chamber wall temperature control means (not shown) are set equal to approximately 20° C.

TABLE-1 shows a first set of experimental results obtained for cases where the to-be-etched material layer 130 consists essentially of ITO supported on glass (silicon dioxide) and the reactive gas supplied from source 150 consists essentially of one or more gases selected from the group composed of $C_2H_5I$, $O_2$, He, and Ar. RF generator 190 was set to a single frequency of 13.6 MHz for both pedestal and plasma and its power level was set to define a power density of approximately 1 $W/cm^2$ relative to the exposed surface 135 of ITO layer 130. The sample size was approximately 270 mm by 360 mm.

TABLE 1

| RUN | $C_2H_5I$ flow (MFC) | $O_2$ sccm | He sccm | Ar sccm | Pressure (mT) [Throttle] | Power (kW) | Etch Time (sec) | Etch (Å/min) | Comments |
|---|---|---|---|---|---|---|---|---|---|
| 1 | $90N_2$ | 0 | 0 | 0 | 60 [100%] | 3 | 180 | 266 | Some gray deposit |
| 2 | $60N_2$ | 0 | 0 | 0 | 40 [5%] | 3 | 180 | — | Bright yellow plasma |
| 3 | $90N_2$ | 0 | 43 | 0 | 60 | 3 | 180 | 262 | Dark |

TABLE 1-continued

| RUN | $C_2H_5I$ flow (MFC) | $O_2$ sccm | He sccm | Ar sccm | Pressure (mT) [Throttle] | Power (kW) | Etch Time (sec) | Etch (Å/min) | Comments |
|---|---|---|---|---|---|---|---|---|---|
| 4 | $90N_2$ | 0 | 87 | 0 | 40 [8%] | 3 | 180 | 131 | yellow Bright yellow |
| 5 | $90N_2$ | 0 | 43 | 0 | 40 [7%] | 3 | 180 | — | Brown deposit |
| 6 | $180N_2$ | 0 | 43 | 0 | 65 [100%] | 3 | 180 | — | |
| 7 | $180N_2$ | 30 | 0 | 0 | 77 [100%] | 3 | 180 | — | |
| 8 | $90N_2$ | 30 | 0 | 0 | 40 [7%] | 3 | 186 | 220 | Dark yellow |
| 9 | $60N_2$ | 30 | 0 | 0 | 40 [6%] | 3 | 180 | 33 | Bright yellow |
| 10 | $90N_2$ | 30 | 0 | 20 | 55 [100%] | 3 | 180 | 204 | |
| 11 | $90N_2$ | 30 | 0 | 0 | 61 [100%] | 3 | 480 | 220 | Dark yellow no deposit |

In the above TABLE-1, the flow rate of the $C_2H_5I$ had not yet been calibrated in terms of sccm. So a corresponding mass flow control rate in terms of sccm of nitrogen was used instead. The symbol "- - -" in the etch rate column indicates that a no etching of ITO was observed and a build up of carbonaceous depositions may also have been observed. The percent throttle indicates how wide open the exhaust throttle valve was.

In the comments field, the yellow color refers to plasma color observed by eye. The deposit color refers to discoloration of the glass substrate as again observed by eye. The various colorations are believed to be due to different disassociations of the $C_2H_5I$ into different combinations of primary radicals under different operating conditions. Of course, it is generally desirable to have no deposition of a discoloring residue on the glass substrate.

As seen in TABLE-1, the etch rate of ITO was greatest in run number 1 when the supplied reactive gas consisted essentially of an MFC rate of $90N_2$ of $C_2H_5$. However, gray discoloration of the glass substrate was occasionally observed. The gray discoloration was attributed to carbonaceous deposits forming on the glass from organic components of the $C_2H_5I$ released from the plasma.

In run number 11 of TABLE-1, 30 sccm of oxygen was added to the $90N_2$ flow of $C_2H_5I$. The etch rate dropped from 266 to 220 Angstroms per minute (Å/min) but the gray discoloration disappeared. It is believed that the added oxygen oxidizes the carbonaceous depositions into volatile byproducts and thereby removes them from the glass substrate.

Comparing run 9 of TABLE-1 against run 2, it is seen that the introduction of oxygen into the input gas flow can have a slightly positive effect on net etch rate. The mechanisms behind this observed increase of etch-rate are not fully understood but are believed to be due to the carbonaceous depositions being returned to the plasma for further reaction with the ITO to produce volatile byproducts such as $In(CH_3)_3$ and $Sn(CH_3)_4$. (See FIGS. 2 and 3 discussed below.)

Comparing run 5 of TABLE-1 against run 3, it is seen that a decrease of chamber pressure from 60 mT down to 40 mT has a detrimental effect on net etch rate. The mechanisms behind this observed change of etch-rate are not fully understood.

The observed positive etch rates of TABLE-1 run numbers 1, 3, 11, 8, 10, 4, and 9 (listed according to decreasing etch rate value) are believed to be due to a combination of chemical and mechanical mechanisms. The applied $C_2H_5I$ gas is believed to dissociate in the presence of the RF energy field and to form free radicals such as $CH_3*$, $CH_2*$, $C_2H_5*$, $H*$, and $I*$, where the symbol * indicates that each respective radical may be charged or uncharged. Electrically charged ones of the freed radicals (ions) are accelerated by the RF field to bombard the exposed thin-film surface 135. This bombardment is believed to result in physical breakup or micro-fragmentation of the exposed surface 135. The micro-fragments then react chemically with either the charged or uncharged radicals, $CH_3*$, $CH_2*$, $C_2H_5*$, $H*$, and $I*$ in the plasma.

A selectivity of 5 to 1 was observed in run number 11 of TABLE-1 for the case where the electrode-supporting substrate consisted essentially of glass ($SiO_2$).

Run number 8 of TABLE-1 was also run with ITO on an amorphous silicon substrate. The observed etch rate of the amorphous silicon substrate was approximately 10 Å/min. The etch-rate of the ITO was again approximately 220 Å/min, resulting in a selectivity of ITO over amorphous silicon of approximately 22 to 1.

Patterned ITO films may be desirably formed on or adjacent to amorphous silicon or other forms of silicon (monocrystalline or polycrystalline) in a variety applications including, but not limited to: (1) photodetection where the silicon functions as a photon-sensitive element; (2) active matrix liquid crystal display (LCD) wherein silicon functions as part of an active control element such as a thin-film transistor (TFT); and (3) sacrificial etch stopping during manufacture wherein ITO functions during manufacture as an etch stop or sacrificial etch barrier that prevents undesired etching of an underlying material (e.g., silicon) while a laterally neighboring material (e.g., metal) is being etched.

TABLE-2 shows a second set of experimental results obtained for cases where the to-be-etched material layer 130 again consists essentially of 900 Å thick ITO, this time supported on a 3000 Å thick passivating silicon nitride ($Si_3N_4$) layer, and the reactive gas supplied from source 150 consists essentially of one or more gases selected from the group composed of $C_2H_5I$, $O_2$, and HCl. RF generator 190 was again set to a single frequency of 13.6 MHz for both pedestal and plasma and its power level was set to define a power density of approximately 1 W/cm² relative to the exposed surface 135 of ITO layer 130. The sample size was approximately 270 mm by 360 mm.

In TABLE-2, each of the runs used a mixture of $C_2H_5I$ and $O_2$ as the input gas 155. Run number 5 of TABLE-2 further included HCl mixed in with other two gases.

amount of positive etching was observed, but again, barely noticeable. The etch-rate is listed in TABLE-2 as being slightly above zero for run number 5.

The results of run number 5 of TABLE-2 appear to indicate that the key to successful etching of ITO does not lie in increasing the amount of free halogen radicals such as I and Cl in the plasma, but rather in breaking down the

TABLE 2

| RUN | $C_2H_5I$ flow (MFC) | $O_2$ sccm | HCl sccm | Pressure (mT) | Power (kW) | Wall Temp- °C. | Etch Rate (Å/min) ITO | Etch Rate (Å/min) P_nitride | Sel | Wall Dep o (Å/min) |
|---|---|---|---|---|---|---|---|---|---|---|
| 1 | 40N₂ | 14 | 0 | 40 | 3.3 | 60 | 211 | 8 | 26.4 | 150 |
| 2 | 40N₂ | 14 | 0 | 40 | 3.3 | 20 | 169 | 8 | 21.1 | 122 |
| 3 | 90N₂ | 30 | 0 | 60 | 3.3 | 20 | 102 | 8 | 12.8 | 280 |
| 4 | 20N₂ | 5 | 0 | 30 | 3.3 | 60 | >0 | N/A | N/A | N/A |
| 5 | 30N₂ | 15 | 200 | 40 | 3.3 | 60 | >0 | N/A | N/A | N/A |

As seen, run number 1 of TABLE-2 exhibited an average etch-rate of 211 Å/min through the 900 Å thick layer of ITO while the simultaneous etch-rate of the supporting silicon-nitride passivated substrate was 8 Å/min. The selectivity, which is defined for TABLE-2 as ITO etch-rate divided by nitride etch-rate, was 26.4, which is considered fairly good. There was some development of carbonaceous depositions on the reaction chamber walls. The wall deposition rate was approximately 190 Å/min.

Run number 2 of TABLE-2 used essentially the same reaction parameters as run number 1 except that the reaction chamber walls were cooled to 20° C. As seen, the lower wall temperature reduced the carbonaceous depositions rate on the walls from 150 Å/min to 122 Å/min. The lower wall temperature also reduced the etch-rate from 211 Å/min down to 169 Å/min and the selectivity from 26.4 down to 21.1. The mechanisms responsible for these results are not fully understood.

In run number 3 of TABLE-2, the reduced wall temperature of 20° C. was maintained while the $O_2$ inflow rate was raised from 14 to 30 sccm (comparing to run number 2) and the $C_2H_5I$ inflow rate was raised from 40N₂ to 90N₂. Chamber pressure rose from 40 Torr to 60 Torr. The etch-rate dropped from 169 Å/min to 102 Å/min while the carbonaceous depositions rate on the walls climbed from 122 Å/min to 280 Å/min. Selectivity dropped from 21.1 to 12.8. As between run numbers 2 and 3 of TABLE-2, run number 2 is considered to have the superior results in terms of all performance categories: etch-rate, selectivity and wall deposition rates.

In run number 4 of TABLE-2, the wall temperature was allowed to float back up to 60° C. while the $C_2H_5I$ inflow rate was dropped from 40N₂ to 20N₂ (as compared to run number 1) and the $O_2$ inflow rate was dropped from 14 to 5 sccm. Chamber pressure dropped from 40 Torr to 30 Torr. A slight amount of positive etching was observed, but barely noticeable. The etch-rate is listed in TABLE-2 as being slightly above zero.

In run number 5 of TABLE-2, an attempt was made to bolster the etch-rate by adding HCl to the input gas flow 155 so that the ratio of halogens (I and Cl) in the plasma was increased relative to $CH_3$. The $C_2H_5I$ inflow rate was increased from 20N₂ to 30N₂ (as compared to run number 4) and the $O_2$ inflow rate was increased from 5 to 15 sccm. Chamber pressure rose from 30 Torr to 40 Torr. A slight $C_2H_5I$ to produce freed organic constituents such as $CH_3^*$, $CH_2^*$, and $C_2H_5^*$ in balance with the freed halogen constituent, $I^*$.

The higher wall temperature of run number 1 of TABLE-2 is believed to return more of the organic constituents such as $CH_3^*$, $CH_2^*$, and $C_2H_5^*$ back to the plasma thereby producing higher etch-rates, and better selectivity. The higher wall temperature of run number 1 of TABLE-2 also appear to undesirably encourage a higher rate of carbonaceous depositions on the reaction chamber walls as compared to run number 2.

When the measured chamber pressure is in the range of 40 Torr to 60 Torr during reaction, with the throttle of the vacuum means 170 in the full-open position, it appears that the results are best. This measured chamber pressure in the range of 40–60 Torr is taken as indicating that the $C_2H_5I$ is being successfully broken down into smaller reactive fragments such as $CH_3^*$, $CH_2^*$, $C_2H_5^*$, $H^*$, and $I^*$ and that volatile reaction byproducts from reaction with ITO are being released so as to produce a pressure in this range of 40–60 Torr.

The following TABLE-3 lists the chemical reactions that are believed to occur between the freed constituents $CH_3^*$, $CH_2^*$, $C_2H_5^*$, $H^*$, and $I^*$ and In and Sn and O to produce volatile byproducts.

TABLE 3

| 1st reactant | 2nd reactant | Volatile by products |
|---|---|---|
| In | $C_2H_5^*$ | $In(CH_3)_3$, $In(C_2H_5)_3$, $In(C_4H_9)_3$ |
| In | $I^*$ | $InI_3$ |
| Sn | $C_2H_5^*$ | $Sn(CH_3)_4$, $Sn(C_2H_5)_4$, $Sn(C_3H_7)_4$ |
| Sn | $I^*$ | $SnI_4$ |
| O | $H^*$ | $H_2O$ |

The byproducts listed in TABLE-3 all have boiling points below 150° C. and are thus believed to be possibly volatile within the plasma environment. As seen, each of the dissociated particles of the $C_2H_5I$ gas generates volatile byproducts when reacted with ITO. The specific ratio of $CH_3$, $CH_2$, $C_2H_5$, and I particles in the plasma may be varied as desired by mixing suitable combinations of $C_2H_5I$ and $O_2$ so as to accommodate for different formulations of $In_xSn_yO_z$.

FIG. 2 shows graphically, the temperature versus vapor pressure relationship of volatile the byproducts $InI_3$, $In(CH_3)_3$, $In(C_2H_5)_3$, $In(C_4H_9)_3$ that are believed to form from the reaction of the indium portion of the ITO layer and the $CH_3$, $CH_2$, $C_2H_5$, and I radicals released from the supplied $C_2H_5I$.

FIG. 3 shows graphically, the temperature versus vapor pressure relationship of volatile the byproducts $SnI_4$, $Sn(CH_3)_4$, $Sn(C_2H_5)_4$, $Sn(C_3H_7)_4$ that are believed to form from the reaction of the tin portion of the ITO layer and the $CH_3$, $CH_2$, $C_2H_5$, and I radicals released from the supplied $C_2H_5I$.

The combination of FIG. 2 and 3 show that the reaction byproducts of ITO and $C_2H_5I$ have vapor pressures that are sufficiently high such that the byproducts can effectively diffuse out from the ITO-under-etch under low pressure, vacuum conditions. The etch reaction is not transport limited. The 50° C. to 150° C. temperature range of FIGS. 2 and 3 conforms with the less-than 130° C. to less-than approximately 150° C. anti-reticulation limits of the mask layer 140. FIG. 4 is a cross sectional view showing how ITO may function as an etch stop or sacrificial etch barrier during patterning of an overlying metal (e.g., MoW) layer, this being followed by highly selective etching of the ITO relative to a protected underlying layer (e.g., $Si_3N_4$).

The manufactured structure 400 of FIG. 4 includes of a pre-planarized lower layer 420 that is partially covered by an $C_2H_5I$-etched ITO layer 430. In one embodiment, layer 420 is composed of $Si_3N_4$. ITO layer 430 has a substantially vertical sidewall 430a defined by $C_2H_5I$ etching in accordance with the invention. Above the ITO layer 430 there is a metal layer 435 having a tapered sidewall surface 435a. The taper angle of the metal sidewall surface 435a is approximately the same as the taper angle of a mask sidewall surface 440a, the latter defining a part of an overlying mask (e.g., photoresist) layer 440 that is ashed away after the formation of structure 400 completes.

Structure 400 is produced as follows. Layers 420, 430, 435, 440 are deposited contiguously, one over the next in the recited order. Next, one or more apertures are defined through the mask layer 440 using photolithography or other appropriate means. The aperture edges are given a desired taper angle such as approximately 30° to 60°. Mask sidewall surface 440a is an example of such a tapered aperture edge.

Next, a first etching agent such as $SF_6$ is used in anisotropic reactive ion etching of the metal layer 435. In one embodiment, the metal layer 435 is composed of MoW (molybdenum tungsten), and the selectivity of the first etching agent ($SF_6$) for the material of the metal layer 435 relative to the sacrificial material of the mask layer 440 is 1-to-1. As such, the taper angle of the mask sidewall surface 440a is copied to the metal layer 435, thereby producing the tapered metal sidewall surface 435a as shown in FIG. 4.

The first etching agent may or may not etch away part of the underlying ITO layer 430 depending on the chemistry used by the first etching step (ETCH #1). In the case of $SF_6$, ITO is substantially immune to attack by fluorine ions because indium fluoride is relatively nonvolatile, and as such, the ITO layer 430 functions as an etch stop. If other etch chemistries are used in the first etching step (ETCH #1), and the ITO is not immune to attack by these, then there may be some removal of the ITO material as well. The latter, sacrificial-type of removal is hinted at in FIG. 4 by the slight continuation of the sidewall taper into portion 431 of the ITO layer. The point of effective etch-through through the metal layer 435 can be detected optically in similar manners to those described above for detecting effective etch-through through the ITO layer, with wavelengths being of course, appropriately selected for the expected reaction byproducts.

After the first etching step (ETCH #1) completes, an exposed portion 431 of the original ITO layer remains extending contiguously from the unexposed portion of the ITO layer 430 that underlies the remaining portion of the metal layer 435.

In a subsequent second etching step (ETCH #2), $C_2H_5I$ is used to anisotropically remove the exposed portion 431 of the original ITO layer by way of RIE while leaving behind the unexposed portion 430 that lies under the remaining metal layer 435. The vertical ITO sidewall 430a forms as a result of this second, selective etching step (ETCH #2). The second etching step (ETCH #2) is preferably carried out in the same RIE chamber 105 as is the first etching step (ETCH #1).

Because the second etching step (ETCH #2) is highly selective in favor of removing ITO as opposed to removing the respective other materials of the adjacent pre-planarized lower layer 420 (e.g., $Si_3N_4$) and the adjacent metal layer 435 (e.g., MoW), the taper angle of the sidewall surface 435a and the planarity of the pre-planarized lower layer 420 can be preserved. The thickness of the ITO layer 430 is preferably much less than that of the metal layer 435, and as such, the lateral transition from the planar top surface of the lower layer 420 to the top surface of the metal layer 435 is primarily defined by the taper angle of the metal sidewall surface 435a. Smooth transitions are preferred over step-like transitions in applications such as LCD displays because the smooth lateral transitions lessen the likelihood of coverage discontinuities when other materials are afterwards conformably deposited on structure 400.

In one experimental test wherein the lower layer 420 consisted essentially of $Si_3N_4$ (a silicon nitride) and the metal layer 435 consisted essentially of MoW, it was observed after the mask layer 440 was ashed away, that the texture of sidewall surface 435a had remained smooth, essentially unscathed by the second etch (ETCH #2) with $C_2H_5I$ and essentially free of residue. As such, conformal deposition of other materials on the combination of the patterned layers 420, 430 and 435 can follow with minimal interference from the preceding selective etch of the ITO layer 430.

FIG. 5 shows perspective and cross sectional view micrographs of one such test result, after ashing away of the photoresist layer. Seen is part of a MoW electrode having a trapezoidal cross section, the MoW electrode being formed on a much thinner, underlying ITO layer. The combination of MoW electrode and underlying ITO layer rests on a pre-planarized $Si_3N_4$ supporting substrate. As seen in the cross sectional view micrograph, the taper angle of the MoW trapezoid is essentially preserved after the ITO layer has been selectively etched with $C_2H_5I$ in accordance with the invention.

Although test results have not yet been obtained for characterizing the selectivity of $C_2H_5I$ for ITO over other materials such as Al, $Al_2O_3$, Cr, Mo, Ta, MoTa, Ti, TiN, W, and TiW, it is expected that the selectivity will be substantially better than 1-to-1 for each of these other materials.

The above disclosure is to be taken as illustrative of the invention, not as limiting its scope or spirit. Numerous modifications and variations will become apparent to those skilled in the art after studying the above disclosure.

By way of example, the reactive gas consisting of $C_2H_5I$ may be replaced by or mixed with other halogen carbohydrates such as $CH_3I$ and/or with other halogen hydrides such as HCl, HF, HBr, or HI. $CH_3I$ is believed to be carcinogenic and is therefor less desirable than $C_2H_5I$ for safety reasons. HI is highly corrosive and is difficult to obtain in commercial quantities in essentially pure form. (HI gas usually contains large amounts of water vapor.) In contrast, ethyl iodide ($C_2H_5I$) is available in commercial quantities in essentially pure form. It turns to gas at 72° C. It has relatively low inhalation toxicity. At room temperature it turns into a colorless liquid having a characteristic odor. The liquid is only moderately irritating to the skin and eyes and spills can be easily cleaned up using gloves and an absorbing cloth. $C_2H_5I$ liquid is flammable in air if ignited but the fire can be extinguished with water or other fire retardant materials such as $CO_2$.

Given the above disclosure of general concepts and specific embodiments, the scope of protection sought is to be defined by the claims appended hereto.

What is claimed is:

1. An etch method comprising the steps of:
   (a) providing a material layer selected from the group consisting of an indium oxide (InO), a tin oxide (SnO), a mixture of indium and tin oxides, a compound of indium and of tin and of oxygen having the general formulation $In_xSn_yO_z$ where z is greater than zero but less than 100% and where the sum x+y fills the remainder of the 100%, and a mixture of the preceding ones of said group;
   (b) supplying an input gas including ethyl iodide ($C_2H_5I$) to a vicinity of the material layer; and
   (c) applying an electric field to react the supplied input gas with the material layer so as to form a volatile byproduct of said input gas and said material layer.

2. An etch method according to claim 1 wherein the supplied input gas is provided to said vicinity at a pressure at least as low as approximately 60 milliTorr.

3. An etch method according to claim 1 wherein the supplied input gas consists essentially of ethyl iodide ($C_2H_5I$).

4. An etch method according to claim 1 wherein the supplied input gas consists essentially of a mixture of ethyl iodide ($C_2H_5I$) and oxygen ($O_2$).

5. An etch method according to claim 1 wherein the pressure of the supplied input gas in said vicinity is at least as low as approximately 40 milliTorr.

6. An etch method according to claim 1 wherein the pressure of the supplied input gas in said vicinity is in the range of approximately 40 milliTorr to 60 milliTorr.

7. An etch method according to claim 1 further comprising the step of:
   (d) providing a substrate below the material layer; wherein the substrate includes a top surface composed essentially of a silicon nitride.

8. An etch method according to claim 1 wherein the applied electric field has a power density of at least approximately 1 watt per centimeter squared (1 W/cm$^2$) as measured relative to exposed surface area portions of the material layer.

9. An etch method according to claim 1 further comprising the step of:
   (d) providing a mask layer over the material layer, the mask layer having one or more apertures defined through the mask layer for exposing a corresponding one or more surface portions of the material layer to the products of the input gas and the applied electric field.

10. An etch method according to claim 9 further comprising the steps of:
    (e) providing a substrate below the material layer;
    (f) determining when the etch process cuts clean through the material layer and begins to attack the substrate; and
    (g) halting the etch process at or about the time of said determination that the etch process has cut clean through the material layer and has begun to attack the substrate.

11. The etch method of claim 10 carried out so as to etch entirely through the provided material layer in a single step.

12. The etch method of claim 1 further comprising the steps of:
    (d) monitoring spectroscopic data obtained from one or more members of a reaction group consisting of In, Sn, 0, $CH_3$, $CH_2$, $C_2H_5$, and I, said reaction group defining one or more reactants or products of said chemical reaction between the supplied input gas and the material layer; and
    (e) halting said etch process at a time point where effective etch-through is indicated to have been achieved by the monitored spectroscopic data.

13. The etch method of claim 12 wherein said step of monitoring includes:
    (d.1) monitoring plasma-induced light emissions from one or more members of said reaction group.

14. The etch method of claim 12 wherein said step of monitoring further includes:
    (d.2) using an optical emission spectroscope for directly collecting and monitoring said plasma-induced light emissions.

15. The etch method of claim 12 wherein said reaction group further consists of hydrogen.

16. An etch method comprising the steps of:
    (a) providing a material layer selected from the group consisting of an indium oxide (InO), a tin oxide (SnO), a mixture of indium and tin oxides, a compound of indium and of tin and of oxygen having the general formulation $In_xSn_yO_z$ where z is greater than zero but less than 100% and where the sum x+y fills the remainder of the 100%, and a mixture of the preceding ones of said group;
    (b) supplying an input gas including ethyl iodide ($C_2H_5I$) to a vicinity of the material layer; and
    (c) applying an electric field in said vicinity for dissociating the supplied input gas to form freed radicals including freed iodide radicals that physically bombard the material layer and react chemically with constituents of the material layer so as to form a volatile byproduct.

17. An etch method according to claim 16 wherein the supplied input gas further includes oxygen.

18. An etch method according to claim 16 further comprising the step of:
    (d) providing a mask layer over the material layer, the mask layer having one or more apertures defined through the mask layer for exposing a corresponding one or more surface portions of the material to the freed radicals.

19. A selective etch method comprising the steps of:
    (a) providing a material layer selected from the group consisting of an indium oxide (InO), a tin oxide (SnO), a mixture of indium and tin oxides, a compound of indium and of tin and of oxygen having the general formulation $In_xSn_yO_z$ where z is greater than zero but less than 100% and where the sum x+y fills the remainder of the 100%, and a mixture of the preceding ones of said group;

(b) providing a second material layer adjacent to the first material layer, said second material layer being composed of a material different from that forming the first material layer, the material of the second material layer being substantially less reactive to ethyl iodide ($C_2H_5I$) than is the material of the first material layer;

(c) supplying an input gas including ethyl iodide ($C_2H_5I$) to a vicinity of the first material layer; and (d) applying an electric field to react the supplied input gas with the first material layer so as to form a volatile byproduct of said input gas and said first material layer.

20. A selective etch method according to claim 19 wherein said another material includes one or more members selected from the group consisting of a metal, silicon, a silicon oxide, a silicon nitride and a silicon oxi-nitrides of the general form $Si_xO_yN_z$ (where each of x, y, z is >0 and x+y+z=100%).

21. A selective etch method according to claim 19 wherein said another material includes a metal selected from the group consisting of Al, Cr, Mo, Ta, Ti, W, MoW, TiW.

22. A selective etch method according to claim 19 wherein said another material includes a form of silicon selected from the group consisting of amorphous and polycrystalline silicon.

23. A selective etch method according to claim 19 wherein said another material includes silicon dioxide.

24. A selective etch method according to claim 19 wherein said another material includes silicon nitride.

* * * * *